United States Patent [19]

Chillara et al.

[11] Patent Number: 5,739,581
[45] Date of Patent: *Apr. 14, 1998

[54] HIGH DENSITY INTEGRATED CIRCUIT PACKAGE ASSEMBLY WITH A HEATSINK BETWEEN STACKED DIES

[75] Inventors: Satya Chillara; Shahram Mostafazadeh, both of San Jose, Calif.

[73] Assignee: National Semiconductor Corporation, Santa Clara, Calif.

[*] Notice: The term of this patent shall not extend beyond the expiration date of Pat. No. 5,442,230.

[21] Appl. No.: 560,280

[22] Filed: Nov. 17, 1995

[51] Int. Cl.⁶ .................... H01L 23/495; H01L 23/10
[52] U.S. Cl. .................... 257/668; 257/675; 257/706; 257/724; 257/738
[58] Field of Search .................... 257/686, 723, 257/724, 725, 668, 675, 693, 700, 701, 706, 737, 738, 778, 784

[56] References Cited

U.S. PATENT DOCUMENTS

| | | |
|---|---|---|
| 5,172,303 | 12/1992 | Bernardoni et al. .................... 257/686 |
| 5,237,204 | 8/1993 | Val .................... 257/724 |
| 5,442,230 | 8/1995 | Chillara et al. .................... 257/666 |
| 5,486,720 | 1/1996 | Kierse .................... 257/725 |
| 5,523,608 | 6/1996 | Kitaoka et al. .................... 257/723 |

OTHER PUBLICATIONS

Houghten, Jon, "Capturing Design Advantages of BGAs", SMT, Mar. 1994, pp. 36–43.

*Primary Examiner*—Tom Thomas
*Assistant Examiner*—David Ostrowski
*Attorney, Agent, or Firm*—Limbach & Limbach L.L.P.

[57] ABSTRACT

An integrated circuit package assembly with a first die disposed over a first substrate having traces defined therein to provide electrical access to the first die. A heatsink is disposed over the substrate and the first die. A second die and a leadframe is disposed over the heatsink. The leadframe provides electrical access to the second die.

35 Claims, 4 Drawing Sheets

HIGH DENSITY INTEGRATED CIRCUIT PACKAGE ASSEMBLY WITH A HEATSINK BETWEEN STACKED DIES

BACKGROUND OF THE INVENTION

The present invention relates generally to an integrated circuit assembly, and more particularly to an assembly for supposing a plurality of integrated circuits, and providing for electrical connection to the integrated circuits by leadframe leads and by conductive traces disposed in the substrate which supports the integrated circuits.

In the field of integrated circuits, it is often desirable to make the integrated circuits as small as possible. As technology has improved and functionality of integrated circuit chips or dies (herein called "dies") has increased, the number of electrical connections required by the typical individual die within an integrated circuit assembly has also increased. Very high density electrical interconnection arrangements are required to connect the die to peripheral circuitry. At the same time, it is desirable to minimize the footprint of the integrated circuit assembly.

One type of integrated circuit assembly for supposing and providing electrical connection for a single integrated circuit chip is set forth in U.S. Pat. No. 5,442,230 (issued Aug. 15, 1995). U.S. Pat. No. 5,442,230 is incorporated herein by reference. In one embodiment of this integrated circuit assembly 30 (shown in FIGS. 1A and 1B), a dielectric substrate 32 defines a predetermined array of electrically conductive traces 40A,B,C and 52A,B,C therethrough. For example, trace 40 has a portion which runs along a top surface 34 of the substrate 32, a potion 40B which runs through a via 41 in the substrate, and a potion 40C which runs along the bottom surface 38 of the substrate 32. Alternatively, the trace can be run around the edge of the substrate instead of through the via 41.

On the bottom surface 38 the traces respectively terminate in solder balls 42, 40D and 52D. However, it should be noted that the traces, which are shown as terminating in solder balls, may alternatively terminate in other ways such as pins, depending on the peripheral circuitry to which the assembly is to be attached and the processes to be used in attaching the assembly to the peripheral circuitry.

A leadframe 48 having a plurality of electrically conductive leadframe leads 48A,B,C,D is disposed on the top surface 34. The leadframe 48 is electrically isolated from the traces. For instance, if the leadframe is disposed over an area of the top surface 34 which contains traces 40A, 52A, then a layer of insulating material 54 may be used to isolate the leadframe 48 from the traces.

The die 44 is supported on the top surface 34 of the substrate 32. The die 44 has a plurality of input/output pads 46A,B,C,D,E,F. As shown in FIG. 2A, each pads is respectively connected to a traces or a lead frame lead by means of bonding wires 56A, 58B, 56B, 58A, 56B and 56D. As shown in FIG. 1A, the package assembly 30 is partially encapsulated in a dielectric medium 60.

In this embodiment, the various input/output pads can be accessed through the leadframe or through the solder balls. The geometry of this assembly, having both leadframe leads and solder balls, allows for greater density than assemblies having only leadframe leads or only solder balls.

SUMMARY OF THE INVENTION

It is an object of the present invention to provide assemblies for supporting and accessing dies with even greater density. It is a further object of the present invention to further minimize the footprint and overall size of package assemblies. It is a further object of the present invention to save printed circuit board space. It is a further object of the present invention to improve heat distribution and dissipation of package assemblies.

According to the present invention, an integrated circuit (IC) package assembly support dies and provides electrical access to the dies. The package assembly includes a substrate having a top surface and a bottom surface and a plurality of first traces from the top surface to the bottom surface. The traces provide electrical access from the bottom surface of the substrate to the top surface of the substrate.

The package assembly further includes a first die disposed on the top surface of the substrate. The first die is electrically connected to the first traces by a plurality of bonding wires. In this way, the first access can be electrically accessed from the bottom of the substrate when the top surface of the substrate is covered or encapsulated.

The package assembly further includes a heatsink having a top surface and a bottom surface, with the bottom surface of the heatsink disposed over the top surface of the substrate, the first die and the bonding wires. The heatsink can be constructed with a cavity to accommodate the die and bonding wires. The heatsink provides heat dissipation and distribution for heat generated by the circuitry of the package assembly.

The package assembly further includes a second die disposed over the top surface of the heatsink. The package assembly further includes a leadframe having a plurality of leadframe leads. The leadframe is disposed over the top surface of the heatsink. A plurality of bonding wires connects the second die to the plurality of leadframe leads. In this way, the second die can be electrically accessed through the leadframe.

The package assembly can be blobbed, encapsulated, or covered by a lid.

Insulative tape can be placed between the heatsink and the substrate, and between the heatsink and the leadframe to provide electrical and/or thermal insulation.

Alternatively, the second die can be placed on a second substrate which is disposed over the heatsink. In this case the leadframe is connected to the second substrate and the second bonding wires connect the second die to the second substrate. In this way, the second die can be electrically accessed through the leadframe and second substrate.

Alternatively, traces can be built into the heatsink, and the second die can then be connected to the heatsink. In this case, the leadframe is connected to the heatsink to provide electrical access to the second die.

Alternatively, the leadframe can be integrated into the heatsink, and the second die can then be connected to the leadframe which is integrated into the heatsink. In this case, the leadframe integrated into the heatsink provides electrical access to the second die.

DETAILED DESCRIPTION OF THE PREFERRED EMBODIMENTS

Figure 2:
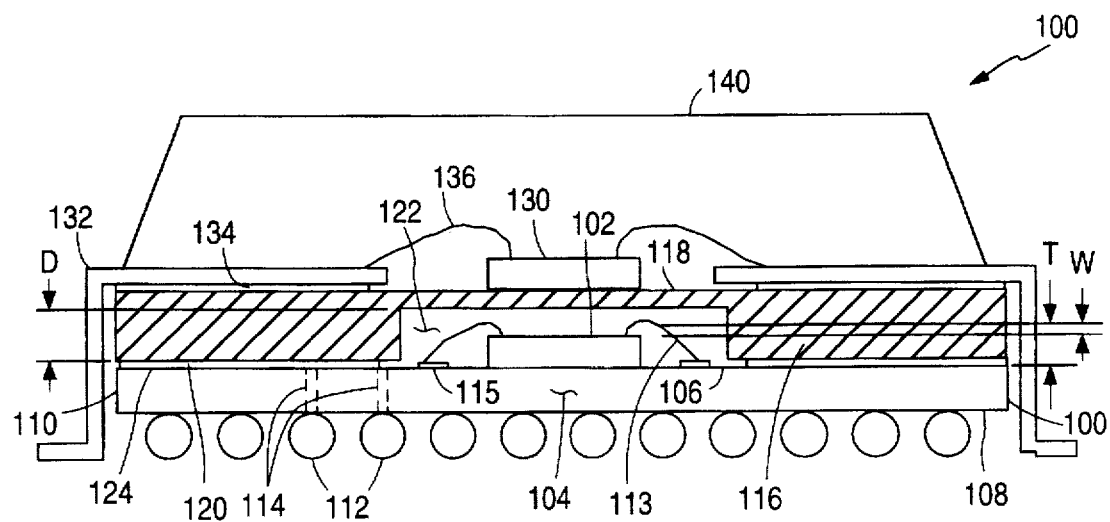
FIG. 2 is a cross-sectional diagrammatic illustration of an package assembly according to a first embodiment of the present invention.

FIG. 2 shows a first embodiment of a package assembly according to the present invention. A first integrated circuit die 102 is supported on a dielectric substrate 104. Although the embodiment of FIG. 2 shows only one die 102 supported on the substrate 104, in some embodiments more than one die are supported on the substrate 104. The substrate 104 has a top surface 106, a bottom surface 108 and a peripheral edge 110.

Figure 1A:
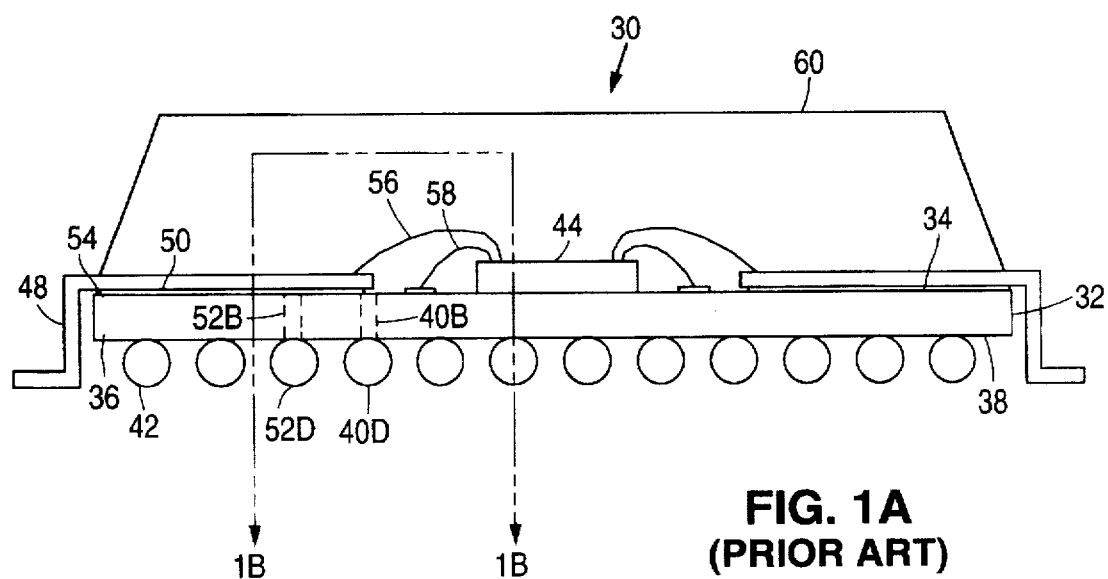
FIG. 1A is an elevational diagrammatic illustration of a package assembly according to the, prior art.
Figure 1B:
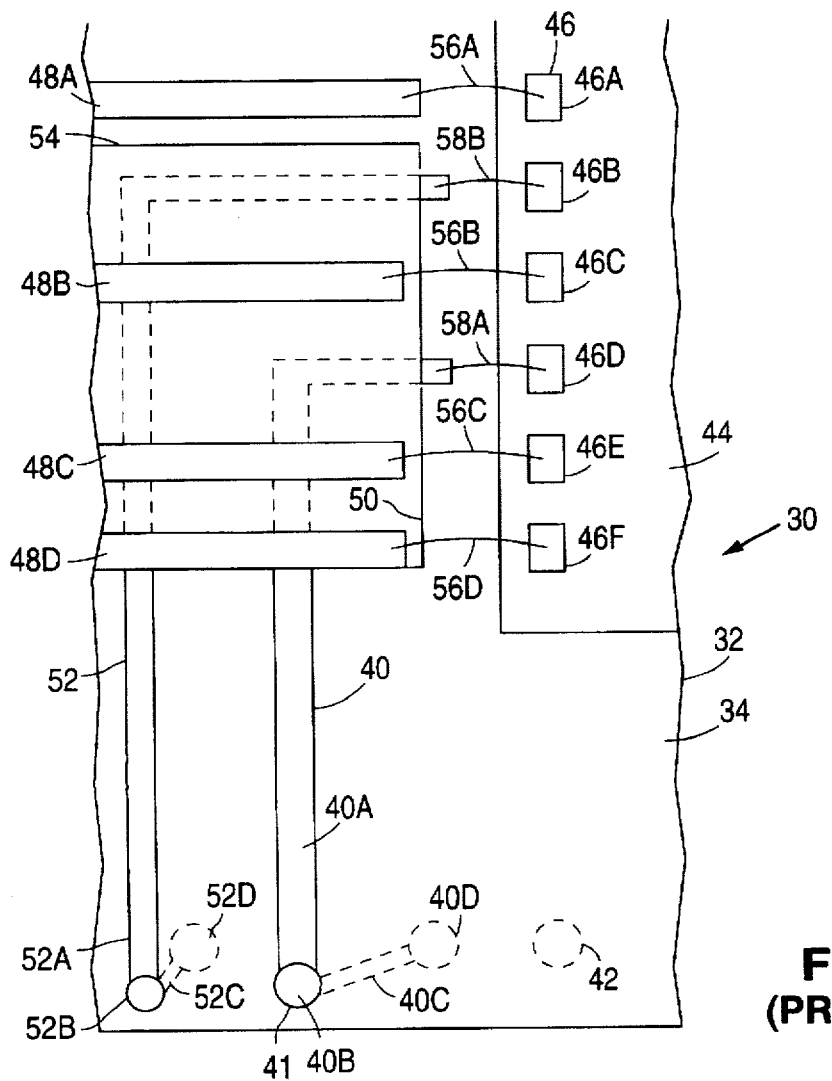
FIG. 1B is a diagrammatic sectional plan of the package assembly shown in FIG. 1A.

The substrate defines a plurality of traces, two of which are shown at reference numeral 114. Similar to the traces 40, 52 shown and described in connection with FIGS. 1A and 1B, a portion of the traces may run along the top surface 106 and/or the bottom surface 108 of the substrate 104. Each trace is a separate and electrically isolated path which allows electrical access between the bottom surface 108 and the top surface 106. The traces can be constructed to run between the top surface 106 and the bottom surface 108 through vias (see, FIG. 1B at via 41). Alternatively, the traces can be constructed to run around the peripheral edge 110 of the substrate 104.

The first die 102 is wirebonded to a portion of the traces 115 at the top surface 106 of the substrate 104 by bonding wires 113. Alternatively, the first die 130 can be connected to the traces 115 at the top surface by tape automated bonding (TAB) or flip chip bonding methods. In this ways, electrical access to the first die 130 is provided through the traces.

At the bottom surface 108, each trace terminates in a solder ball 112. The solder balls are connected to peripheral circuitry when the package assembly is put into use. The solder balls 112 may be disposed to form a grid array. Depending upon the application, solder columns or pins can be used instead of solder balls.

Heatsink 116 has a top surface 118 and a bottom surface 120. As shown, the bottom surface 120 is disposed 'over' the top surface 106 of the substrate 104. Please note that throughout this specification and appended claims, the phrase 'disposed over' is used to mean facing and reasonably proximate to, but not necessarily in contact with. The phrase 'disposed on' is used to mean facing and in contact with. Insulative layer 124 is between the bottom surface 120 of the heatsink 116 and the top surface 106 of the substrate 104. Therefore, the heatsink 116 is disposed over the substrate 104, the first die 102 and the bonding wires 113. The heatsink 116 is disposed over and disposed on the insulative layer 124.

Figure 7:
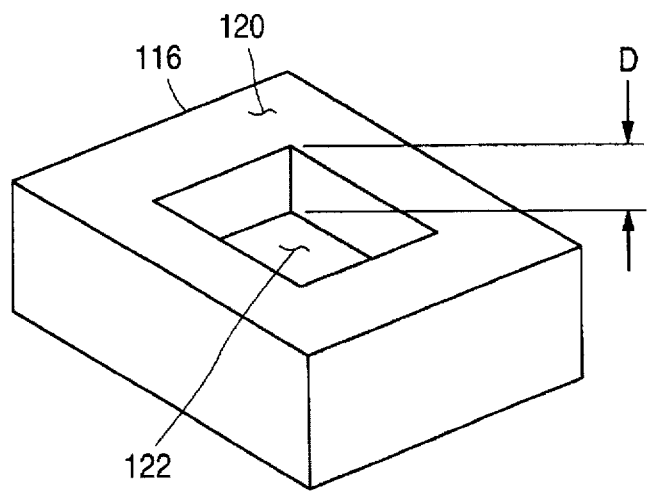
FIG. 7 is a perspective view of a heatsink.

The heatsink 116 is shown in cross-section in FIG. 2. A perspective view of the heatsink 116 is shown in FIG. 7. As shown in FIGS. 2 and 7, the heatsink 116 has a cavity 122 in its bottom surface 120 to accommodate the first die 102 and the bonding wires 113. Preferably, the depth D of the cavity should be greater than the combined height T+W of the thickness T of the first die and any wire bond loop height W associated with the bonding wires 113, in order to prevent the heatsink 116 from putting stress on the die 102 or bonding wires 113. As shown in FIG. 2, the thickness of the insulating layer 122 may also help to accommodate the die 102 and bonding wires 113 (thereby slightly reducing the required depth D of the cavity).

The heatsink 116 may be made of anodized aluminum, copper, ceramic, or any thermally dissipative material. The heatsink 116 dissipates and distributes heat generated by the circuitry of the package assembly.

The insulative layer 124 may be formed of dielectric tape or non-conductive epoxy. The insulative layer 124 bonds the heatsink 116 to the substrate 104. The insulative layer 124 provides electrical and thermal insulation between the heatsink 116 and the substrate 104. When the heatsink is made of a conductive material, electrical insulation is especially important because portions of the traces 114 defined in the substrate run along the top surface 106 of the substrate 104. Without electrical insulation, an electrically conductive heatsink 116 could short the traces.

A second integrated circuit die 130 is disposed on the top surface 118 of the heatsink 116. Alternatively, more than one die may be disposed on the top surface 118 of the heatsink 116. A lead frame 132 is disposed over the top surface 118 of the heatsink 116 as well. In the embodiment shown in FIG. 2, an insulative layer 134 is disposed between the leadframe 132 and the heatsink 116. The leadframe 132 has a plurality of separate leads to provide separate paths for electrical access.

The second die 130 is wirebonded to a portion of the leads of the leadframe by bonding wires 136. Alternatively, the second die can be connected to the leadframe by tape automated bonding (TAB) or flip chip bonding methods. In this ways, electrical access to the second die 130 is provided through the leadframe 132.

The insulative layer 134 may be formed of dielectric tape or non-conductive epoxy. The insulative layer 134 bonds the heatsink 116 to the leadframe 132. The insulative layer 134 provides electrical and thermal insulation between the heatsink 116 and the leadframe 132. When the heatsink 116 is made of a conductive material, electrical insulation is especially important. Without electrical insulation, an electrically conductive heatsink 116 could short the leads of the leadframe.

A plastic or metal lid 140 covers the package assembly 100 to protect it. Alternatively, the package assembly 100 can be provided with a protective over-mold by overmolding. The package assembly 100 may be encapsulated with an encapsulant. For instance, epoxy resin may be blobbed to cover and encapsulate at least the second die 130 and the bonding wires 136.

Figure 3:
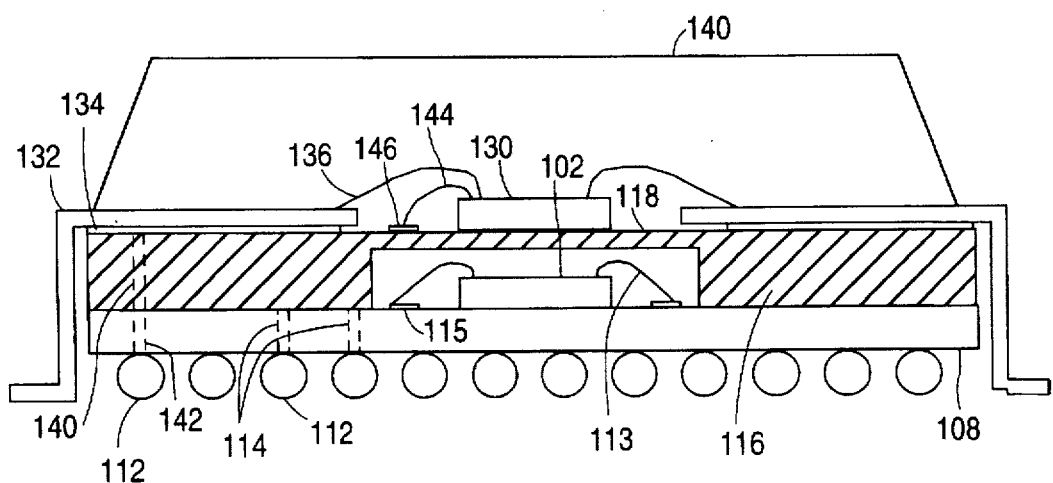
FIG. 3 is a cross-sectional diagrammatic illustration of an package assembly according to a second embodiment of the present invention.

FIG. 3 shows a second embodiment of the present invention wherein features denoted by reference numerals appearing in FIG. 2 are similar to the features of FIG. 2 and are not separately discussed. In the embodiment of FIG. 3 traces 140 are provided in the heatsink 116 and additional traces 142 are provided in substrate 104 to allow electrical access to the second die 130 through the solder balls 112 at the bottom surface 108 of the substrate 104.

The traces 140 in the heatsink 116 run along the top surface 118 of the heatsink 116. The second die 130 is wirebonded to a portion the of traces 146 at the top surface 118 by bonding wires 144. The traces 140 run around or through the heatsink 116 and come into contact with the additional traces 142 of the substrate 104. In the embodiment of FIG. 3, the insulative layer 124 is omitted to allow contact between the traces 140 and the additional traces 142. The additional traces 142 terminate in solder balls 112. In this way, the second die 130 can be accessed through the solder balls 112, as well as through the leadframe 132.

In the embodiment of FIG. 3, care must be taken to electrically isolate the traces 140 at the top surface 118 of the heatsink 116 from the leadframe 132. This may be accomplished by the insulative layer 134. Also, if the traces 140 must be electrically isolated from each other.

Figure 4:
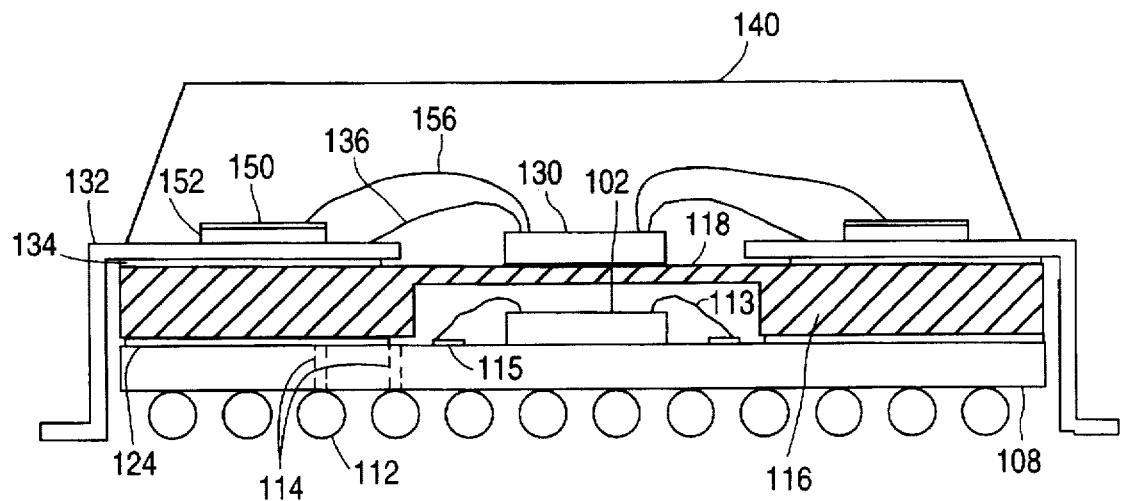
FIG. 4 is a cross-sectional diagrammatic illustration of an package assembly according to a third embodiment of the present invention.

FIG. 4 shows a third embodiment of the present invention wherein features denoted by reference numerals appearing in FIG. 2 are similar to the features of FIG. 2 and are not separately discussed. In the embodiment of FIG. 4, a conductive plane 150 is disposed over the leadframe 132. Alternatively, the conductive plane 150 could be disposed over a portion of the top surface 118 of the heatsink 116 which is not covered by the leadframe 116.

The conductive plane 150 may be powered be powered by a source (not shown) and serve as a power plane. Alternatively, the conductive plane 150 may be grounded and serve as a ground plane. The conductive plane 150 is insulated from the leadframe 132 by an insulative layer 152. The second die is connected to the conductive plane by one or more bonding wires 156. In this way, the conductive plane provides power or grounding for the second die 130.

Figure 5:
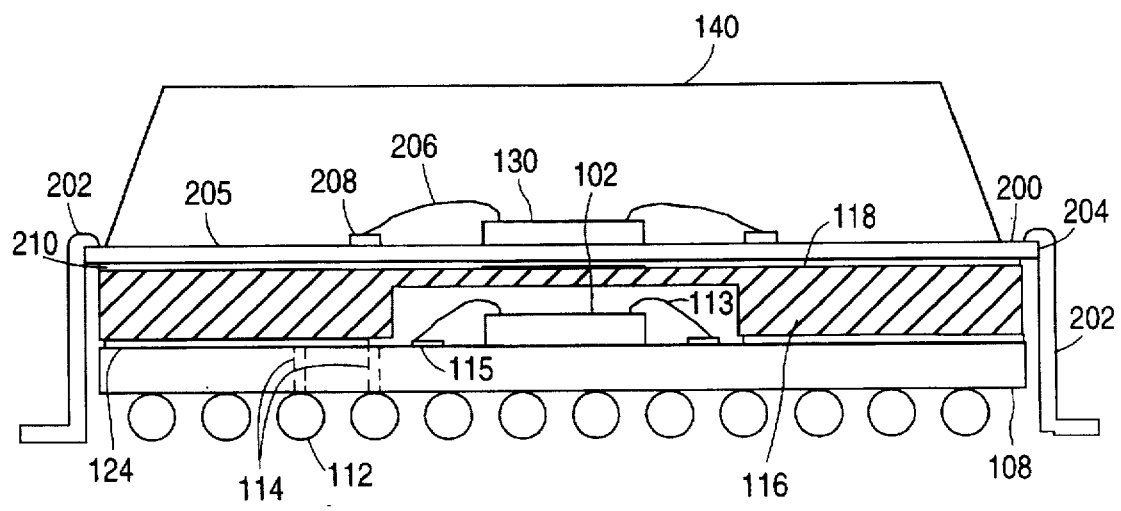
FIG. 5 is a cross-sectional diagrammatic illustration of an package assembly according to a fourth embodiment of the present invention.

FIG. 5 shows a fourth embodiment of the present invention wherein features denoted by reference numerals appearing in FIG. 2 are similar to the features of FIG. 2 and are not separately discussed. In the embodiment of FIG. 5, a second dielectric substrate 200 is disposed over the top surface 118 of the heatsink 116. The second die 130 is connected to the second substrate 200 by wire bonding. Alternatively, the second die 130 can be connected to the second substrate 200 by tape automated bonding or flip chip bonding.

In the embodiment of FIG. 5, leadframe 202 is wirebonded to a peripheral edge 204 of the second substrate 200. Alternatively, the leadframe 202 may be integrated with the second substrate 200 using techniques such as Au/Sn eutectic bonding, Au/Ag thermocompression bonding, solder (e.g., 96.5 Sn/3.5 Ag or 90 Sn/10 Pb), Z-conductive adhesive, or solder ball attachment techniques.

Traces run along the top surface 205 of the second substrate 200. The second die 130 is connected to a portion 208 of the traces by bonding wires 206. In this way, the traces of the second substrate 200 provide electrical access from the leadframe 202 to the second die 130. Alternatively, if the leadframe 202 is integrated with the second substrate 200, then the second die 130 may be connected directly to the leadframe 202.

An insulative layer 210 provides for adhesion, thermal insulation and electrical insulation between the second substrate 200 and the heatsink 116.

Figure 6:
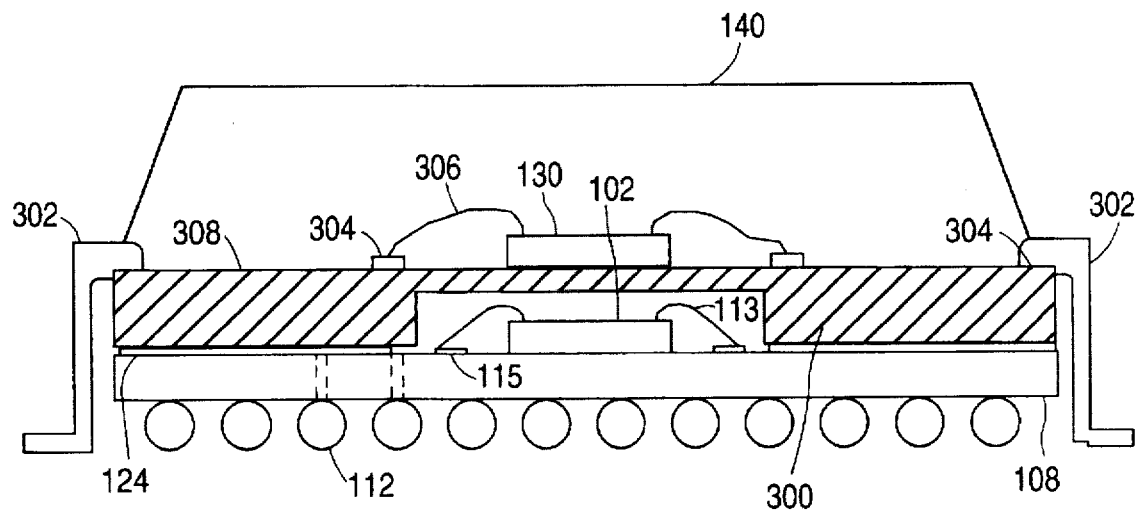
FIG. 6 is a cross-sectional diagrammatic illustration of an package assembly according to a fifth embodiment of the present invention.

FIG. 6 shows a fifth embodiment of the present invention wherein features denoted by reference numerals appearing in FIG. 2 are similar to the features of FIG. 2 and are not separately discussed. In the embodiment of FIG. 6, a heatsink 300 is defined with traces. The second die 130 is connected to the heatsink 300 by wire bonding. Alternatively, the second die 130 can be connected to the heatsink 300 by tape automated bonding or flip chip bonding.

In the embodiment of FIG. 6, leadframe 302 is wirebonded at a peripheral end 304 of the heatsink. Alternatively, the leadframe 302 may be integrated with the heatsink 300 using techniques such as Au/Sn eutectic bonding, Au/Ag thermocompression bonding, solder (e.g., 96.5 Sn/3.5 Ag or 90 Sn/10 Pb), Z-conductive adhesive, or solder ball attachment techniques.

Traces run along the top surface 308 of the heatsink 300. These traces may be in the form of a thin film made by thin film techniques. The second die 130 is connected to a portion 304 of the traces defined in the heatsink 300 by bonding wires 306. In this way, the traces of the heatsink 300 provide electrical access from the leadframe 302 to the second die 130. Alternatively, if the leadframe 302 is integrated with the heatsink 300, then the second die 130 may be connected directly to the leadframe 302.

In the above-described embodiments of the present invention, dies are placed in two layers in a stacked geometry with a heatsink between the layers. This geometry can increase the density of the package It should be understood that the present invention may be embodied in many other specific forms without departing from the spirit or scope of the invention. The above-described embodiments are to be considered as illustrative and not restrictive, and the invention is not to be limited to these embodiments.

What is claimed is:

1. An integrated circuit (IC) package assembly for supporting dies and providing access to dies, the package assembly comprising:

a substrate having a top surface, a bottom surface and a plurality of first traces from the top surface to the bottom surface;

a first die disposed over the top surface of the substrate and electrically connected to the first traces at the top surface of the substrate;

a heatsink having a top surface and a bottom surface, with the bottom surface of the heatsink disposed over the top surface of the substrate and over the first die;

a leadframe having a plurality of leadframe leads, with the leadframe disposed over the top surface of the heatsink; and a second die disposed over the top surface of the heatsink and electrically connected to the leads of the leadframe.

2. The package assembly according to claim 1, further comprising a plurality of solder balls respectively connected to each of the plurality of first traces at the bottom surface of the substrate.

3. The package assembly according to claim 1, further comprising a lid that at least partially covers the package assembly.

4. The package assembly according to claim 1, further comprising an over-mold that at least partially covers the package assembly.

5. The package assembly according to claim 1, wherein the package assembly is at least partially covered by an encapsulant.

6. The package assembly according to claim 1, wherein the heatsink has a cavity defined in its bottom surface for accommodating the first die.

7. The package assembly according to claim 6, further comprising:

a plurality of bonding wires for electrically connecting the first die to the traces at the top surface of the substrate; and wherein the cavity has a depth measured from the bottom surface of the heatsink which is greater than a combined height of a thickness of the first die and a wire bond loop height of the bonding wires.

8. The package assembly according to claim 1, wherein the heatsink is made of anodized aluminum.

9. The package assembly according to claim 1, wherein the heatsink is made of copper.

10. The package assembly according to claim 1, wherein the heatsink is made of ceramic.

11. The package assembly according to claim 1, further comprising a layer of insulating material between at least a portion of the top surface of the substrate and at least a portion of the bottom surface of the heatsink.

12. The package assembly according to claim 11, wherein the layer of insulating material is made of adhesive insulating tape.

13. The package assembly according to claim 11, wherein the layer of insulating material is made of non-conductive epoxy.

14. The package assembly according to claim 1, further comprising a layer of insulating material between at least a portion of the top surface of the heatsink and at least a portion of the leadframe.

15. The package assembly according to claim 14, wherein the layer of insulating material is made of adhesive insulating tape.

16. The package assembly according to claim 14, wherein the layer of insulating material is made of non-conductive epoxy.

17. The package assembly according to claim 1, further comprising:

a first layer of insulating material between at least a portion of the top surface of the substrate and at least a portion of the bottom surface of the heatsink; and a second layer of insulating material between at least a portion of the top surface of the heatsink and at least a portion of the leadframe.

18. The package assembly according to claim 1, wherein the bottom surface of the heatsink is disposed on the top surface of the substrate.

19. The package assembly according to claim 1, wherein the leadframe is disposed on the top surface of the heatsink.

20. The package assembly according to claim 1, wherein at least one of the plurality of first traces runs from the top surface of the substrate to the bottom surface of the substrate through a via defined in the substrate.

21. The package assembly according to claim 1, wherein at least one of the plurality of first traces runs from the top surface of the substrate to the bottom surface of the substrate by running around a peripheral edge of the substrate.

22. The package assembly according to claim 1, wherein the first die is connected to the first traces by tape automated bonding.

23. The package assembly according to claim 1, wherein the first die is connected to the first traces by flip chip bonding.

24. The package assembly according to claim 1, further comprising bonding wires for connecting the first die to the first traces by wirebonding.

25. The package assembly according to claim 1, wherein the second die is connected to the leadframe by tape automated bonding.

26. The package assembly according to claim 1, wherein the second die is connected to the leadframe by flip chip bonding.

27. The package assembly according to claim 1, further comprising bonding wires for connecting the second die to the leadframe by wirebonding.

28. The package assembly according to claim 1, wherein:

the heatsink has a plurality of second traces from the top surface of the heatsink to the bottom surface of the heatsink;

the substrate has a plurality of third traces from the top surface of the substrate to the bottom surface of the substrate; and the second traces of at the bottom surface of the heatsink respectively contact third traces at the top surface of the substrate; and the second die is electrically connected to the second traces at the top surface of the heatsink.

29. The package assembly according to claim 1, further comprising:

an insulating layer disposed on at least a portion of the leadframe; and a conductive plane disposed on the insulating layer, the second die being electrically connected to the conductive plane.

30. The package assembly according to claim 29, wherein the conductive plane is a power plane.

31. The package assembly according to claim 29, wherein the conductive plane is a ground plane.

32. An integrated circuit (IC) package assembly for supporting dies and providing access to dies, the package assembly comprising:

a first substrate having a top surface, a bottom surface and a plurality of first traces from the top surface to the bottom surface;

a first die disposed over the top surface of the first substrate and electrically connected to the first traces at the top surface of the first substrate;

a heatsink having a top surface and a bottom surface, with the bottom surface of the heatsink disposed over the top surface of the first substrate and the first die;

a second substrate having a top surface, a bottom surface, and a plurality of second traces, with the bottom surface of the second substrate disposed over the top surface of the heatsink;

a leadframe electrically connected to the second traces; and a second die disposed on the top surface of the second substrate and electrically connected to the second traces.

33. An integrated circuit (IC) package assembly for supporting dies and providing access to dies, the package assembly comprising:

a first substrate having a top surface, a bottom surface and a plurality of traces from the top surface to the bottom surface;

a first die disposed over the top surface of the first substrate and electrically connected to the first traces at the top surface of the first substrate;

a heatsink having a top surface and a bottom surface, with the bottom surface of the heatsink disposed over the top surface of the first substrate and the first die;

a second substrate having an integrated leadframe, a top surface and a bottom surface, with the bottom surface of the second substrate disposed over the top surface of the heatsink; and a second die disposed on the top surface of the second substrate and electrically connected to the second traces.

34. An integrated circuit (IC) package assembly for supporting dies and providing access to dies, the package assembly comprising:

a substrate having a top surface, a bottom surface and a plurality of first traces from the top surface to the bottom surface;

a first die disposed on the top surface of the substrate and electrically connected to the first traces at the top surface of the substrate;

a heatsink having a top surface and a bottom surface, and a plurality of second traces, with the bottom surface of the heatsink disposed over the top surface of the substrate and the first die;

a second die disposed over the top surface of the heatsink and electrically connected to the second traces; and a leadframe electrically connected to the second traces.

35. The package assembly according to claim 34, wherein the traces of heatsink comprise a thin film located at the top surface of the heatsink which is made by thin film techniques.

* * * * *